United States Patent
Duvdevany et al.

(10) Patent No.: US 10,365,474 B2
(45) Date of Patent: Jul. 30, 2019

(54) PHASE ERROR MEASUREMENT FOR OSCILLATING MIRRORS

(71) Applicant: STMicroelectronics Ltd, Netanya (IL)

(72) Inventors: Offir Duvdevany, Tel Aviv-Jaffa (IL); Naomi Petrushevsky, Yavne (IL)

(73) Assignee: STMicroelectronics Ltd, Netanya (IL)

( * ) Notice: Subject to any disclaimer, the term of this patent is extended or adjusted under 35 U.S.C. 154(b) by 71 days.

(21) Appl. No.: 15/613,455

(22) Filed: Jun. 5, 2017

(65) Prior Publication Data

US 2018/0348506 A1 Dec. 6, 2018

(51) Int. Cl.
  *G02B 26/08* (2006.01)
  *H03L 7/081* (2006.01)
  *G02B 26/10* (2006.01)
  *H04N 9/31* (2006.01)

(52) U.S. Cl.
  CPC ......... *G02B 26/0833* (2013.01); *G02B 26/10* (2013.01); *H03L 7/0814* (2013.01); *H04N 9/3129* (2013.01)

(58) Field of Classification Search
  CPC .. G02B 26/0833; G02B 26/10; G02B 26/085; H03L 7/0814; H04N 9/3129

USPC ..................................................... 359/223.1
See application file for complete search history.

(56) References Cited

U.S. PATENT DOCUMENTS 7,907,019 B1 * 3/2011 Brown ................ G02B 26/085
                                                              331/1 A
8,553,308 B2    10/2013 Goren et al.

\* cited by examiner

*Primary Examiner* — Euncha P Cherry
(74) *Attorney, Agent, or Firm* — Crowe & Dunlevy

(57) ABSTRACT

Disclosed herein is a mirror controller for an oscillating mirror. The mirror controller includes a processor configured to receive a mirror sense signal from the oscillating mirror and to determine a phase error between the mirror sense signal and a mirror drive signal. The processor determines the phase error by sampling the mirror sense signal at a first time, sampling the mirror sense signal at a second time at which the mirror sense signal is expected to be equal to the mirror sense signal as sampled at the first time, and generating the phase error as a function of a difference between the sample of the mirror sense signal at the second time and the sample of the mirror sense signal at the first time.

21 Claims, 8 Drawing Sheets

PHASE ERROR MEASUREMENT FOR OSCILLATING MIRRORS

TECHNICAL FIELD

This disclosure relates to the measuring of a phase error between a drive signal for an oscillating mirror and an opening angle of the oscillating mirror, and to the control of the oscillating mirror based upon the phase error.

BACKGROUND

Certain devices such as wafer defect scanners, laser printers, augmented reality devices, document scanners, projectors and the like often employ a collimated laser beam that scans across a surface in a straight or curved line path. These devices employ tilting mirrors to deflect the beam to perform the scanning. These tilting mirrors may be, or may include, Micro Electro Mechanical Systems ("MEMS") devices. The actuation of mirrors used in MEMS devices, referred to herein as MEMS mirrors, can be via the electromagnetic, electrostatic, piezoelectric, and thermoelectric effects, depending on application.

One type of common MEMS mirror includes a stator and a rotor, with the rotor or structures carried by the rotor being reflective. The stator and/or rotor are driven with a drive signal which results in the rotor oscillating with respect to the stator, thereby changing the angle of reflectance of an incident light beam on the rotor. By oscillating the rotor between two orientations, an opening angle of the mirror is defined, and scanning of the light beam across the surface is accomplished.

Precise control of the opening angle of the mirror is desirable for the precise application in which such mirrors are used. When there is a non-constant phase difference between the drive signal and the angle of the rotor, it can be difficult to synchronize the MEMS mirror with the light beam to clearly project images onto a surface. Video standards, especially high definition video standards use hundreds of bits per scan line, hence the significance in the accuracy of the precise control of the mirror's position and the synchronization with the light beam.

So as to provide this precise control, development in the area of the detection of such phase differences, and in the control of such phase differences to maintain them as desired, is needed.

SUMMARY

Disclosed herein is an electronic device including a mirror controller for an oscillating mirror driven by a mirror drive signal. The mirror controller includes a phase error calculation block configured to receive a mirror sense signal from the oscillating mirror and to determine a phase error between the mirror sense signal and a mirror drive signal by comparing values of the mirror sense signal separated in time by one quarter of oscillation period of an expected period of the mirror drive signal, an error calculation block configured to generate an error signal as a function of the phase error and a target phase error, and a phase correction block configured to generate a mirror control signal for the oscillating mirror as a function of the error signal.

The phase error calculation block determines the phase error by sampling the mirror sense signal at a first time, sampling the mirror sense signal at a second time, with the second time being spaced apart from the first time by one quarter of the expected period of the mirror drive signal, and generating the phase error as a function of a difference between the sample of the mirror sense signal at the second time and the sample of the mirror sense signal at the first time.

Disclosed herein is a mirror controller for an oscillating mirror. The mirror controller includes a processor configured to receive a mirror sense signal from the oscillating mirror and to determine a phase error between the mirror sense signal and a mirror drive signal. The processor determines the phase error by sampling the mirror sense signal at a first time, sampling the mirror sense signal at a second time at which the mirror sense signal is expected to be equal to the mirror sense signal as sampled at the first time, and generating the phase error as a function of a difference between the sample of the mirror sense signal at the second time and the sample of the mirror sense signal at the first time.

In some cases, the second time may be spaced apart from the first time by one quarter of an expected period of the mirror drive signal. In other cases, the second time may be spaced apart from the first time by one half of an expected period of the mirror drive signal. In still other cases, the second time may be spaced apart from the first time by three quarters of an expected period of the mirror drive signal. Indeed, the second time may be spaced apart from the first time by a multiple of one quarter of an expected period of the mirror drive signal.

The first and second times are times at which the first and second samples of the mirror sense signal would be equal in the absence of the phase error.

The processor generates the phase error as zero where the first and second times are times at which a derivative of capacitance of the oscillating mirror with respect to time is zero.

Also disclosed herein is a method of operating an oscillating mirror that includes driving the oscillating mirror with a mirror drive signal, receiving a mirror sense signal from the oscillating mirror, and determining a phase error between the mirror sense signal and the mirror drive signal by comparing values of the mirror sense signal separated in time by one quarter of oscillation period of an expected period of the mirror drive signal. The method also includes generating an error signal as a function of the phase error and a target phase error, and generating a mirror control signal for the oscillating mirror as a function of the error signal.

DETAILED DESCRIPTION

Figure 1:
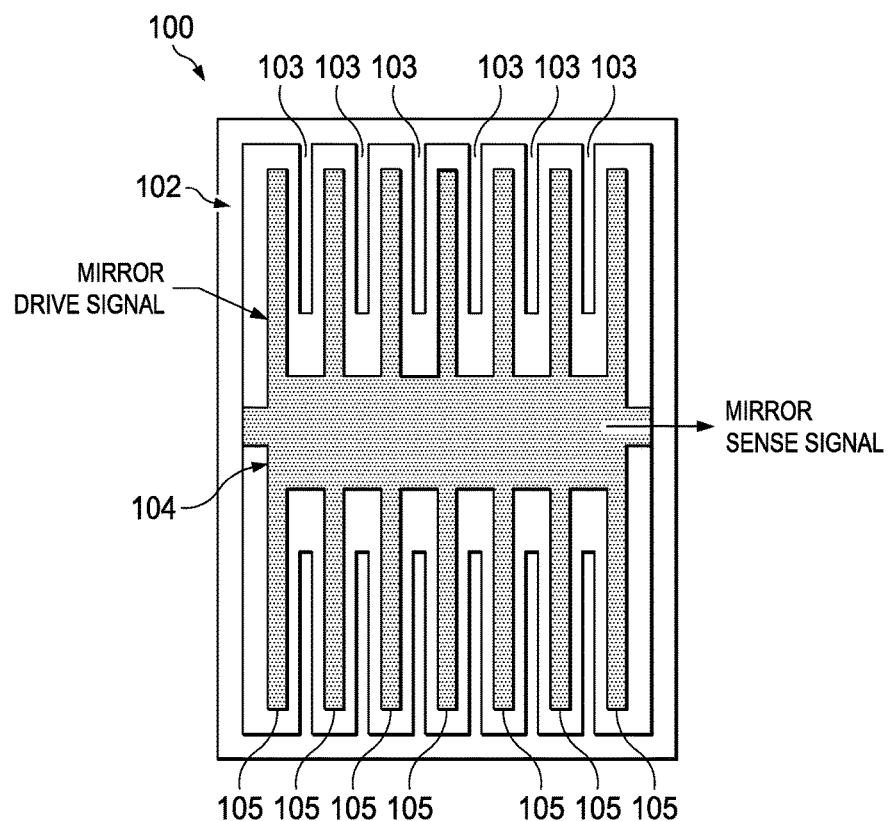
FIG. 1 is a top plan view of a movable MEMS mirror such as may be used with the techniques described in this disclosure.

One or more embodiments of the present disclosure will be described below. These described embodiments are only examples of the presently disclosed techniques. Additionally, in an effort to provide a concise description, all features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Like reference numbers in the drawing figures refer to like elements throughout.

First, a movable MEMS mirror 100, such as may be used in devices such as wafer defect scanners, laser printers, document scanners, augmented reality devised, projectors, and pico-projectors, will now be described with reference to FIG. 1. The movable MEMS mirror 100 includes a stator 102 having inwardly projecting fingers 103. A rotor 104 is positioned within the stator 102 and has outwardly projecting fingers 105 that interleave with the inwardly projecting fingers 103 of the stator 102. The rotor 104 oscillates about its axis, oscillating its mirror surface with respect to the stator 102.

Either the stator 102 or the rotor 104 is supplied with a periodic mirror drive signal, such as a square wave (see, FIG. 4), while the other is supplied with a reference voltage. As shown in FIG. 1, the stator 102 is supplied with the mirror drive signal and the rotor 104 produces a mirror sense signal. In some cases, however, the rotor 104 may instead be supplied with the mirror drive signal and the stator may produce the mirror sense signal.

In the case where the mirror drive signal has an oscillating square voltage, for example, electrostatic forces cause the rotor 104 to oscillate about its axis relative to the stator 102. In the case where the mirror drive signal has an oscillating square current, for example, magnetic forces cause the rotor 104 to oscillate about its axis relative to the stator 102. Indeed, the movable MEMS mirror 100 may be driven according to any suitable way known to those of skill in the art, such as through the use of the piezoelectric effect of thermoelectric effect. As another example, the movable MEMS mirror 100 may be driven by driving current flow though a coil, creating an electromagnetic field used to drive the rotation of the rotor 104. Thus, it should be understood that the techniques, circuits, and methods described herein are applicable to any movable MEMS mirror 102, regardless of how it is driven.

For use in scanning a light beam across a surface, the movable MEMS mirror 100 is driven so that it oscillates at a frequency close to its resonant frequency between two set or controllable oscillation limits. In some cases, the movable MEMS mirror 100 may be driven outside of its resonance frequency, for example driven in a quasi-static or linear mode.

Figure 2:
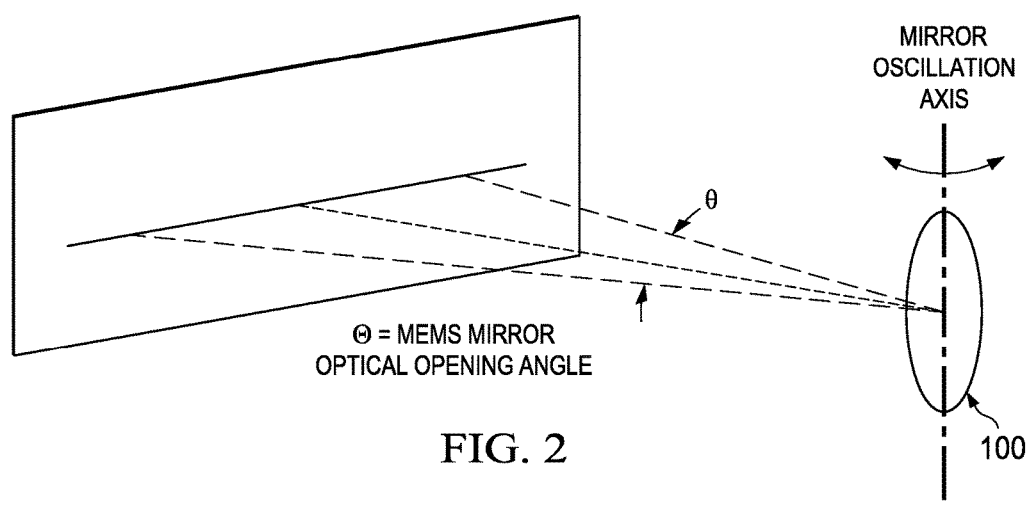
FIG. 2 is a perspective view showing operation of a movable MEMS mirror scanning.
Figure 3:
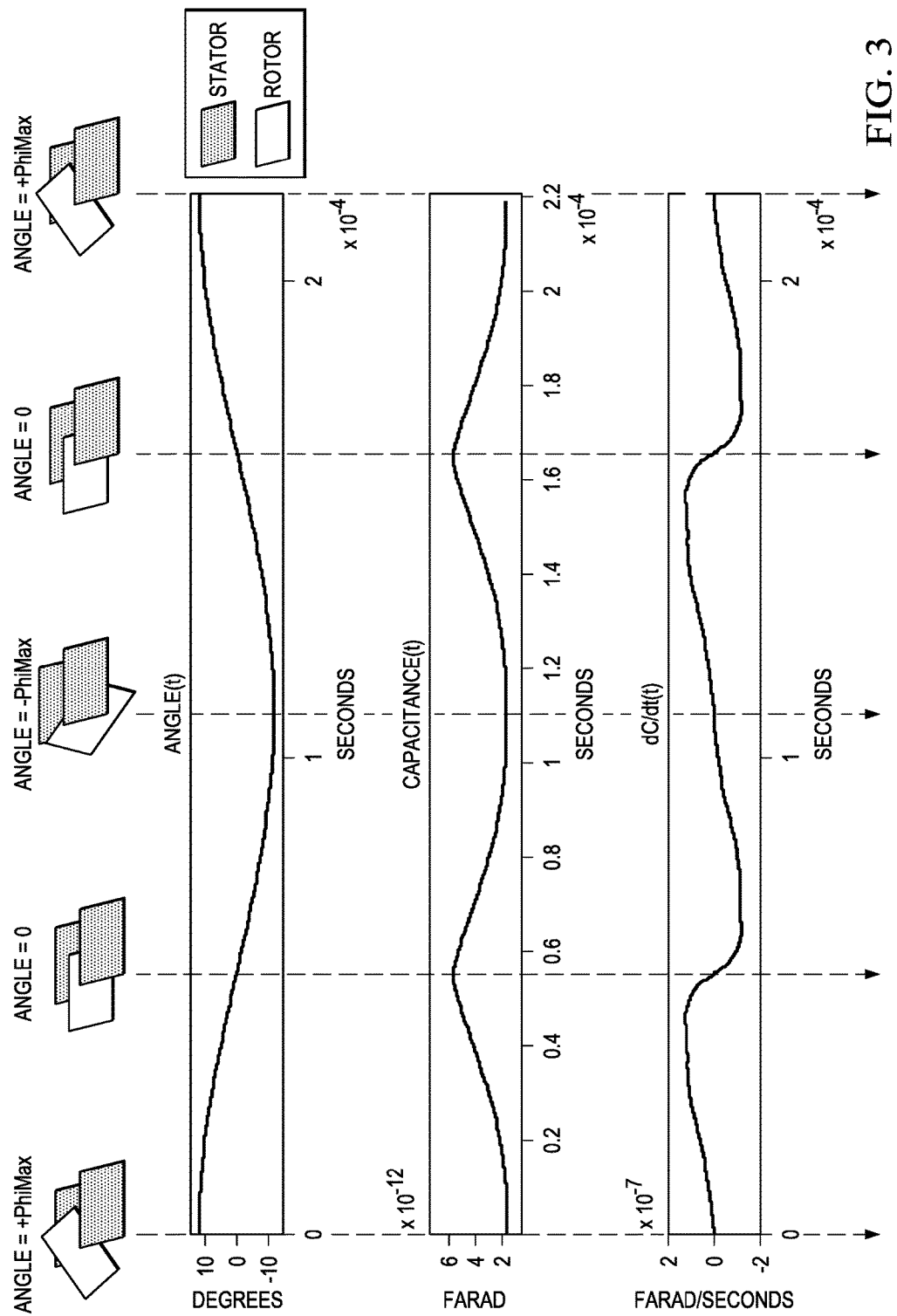
FIG. 3 is a graph showing the opening angle of a movable MEMS mirror vs its capacitance.

Shown in FIG. 2 is the movable MEMS mirror 100 scanning a light beam across a projection screen between two set rotation limits that define an "opening angle" θ of the movable MEMS mirror 100. As can be seen in the graphs of FIG. 3, the opening angle θ of the movable MEMS mirror 100 is related to the capacitance of the movable MEMS mirror 100. The capacitance of the movable MEMS mirror 100 peaks when the opening angle θ is at zero, as can be seen. Thus, as can also be seen, the derivative of capacitance of the movable MEMS mirror 100 with respect to time is zero where the opening angle θ is zero, where the opening angle θ is at a maximum, and where the opening angle θ is at a minimum.

Figure 4:
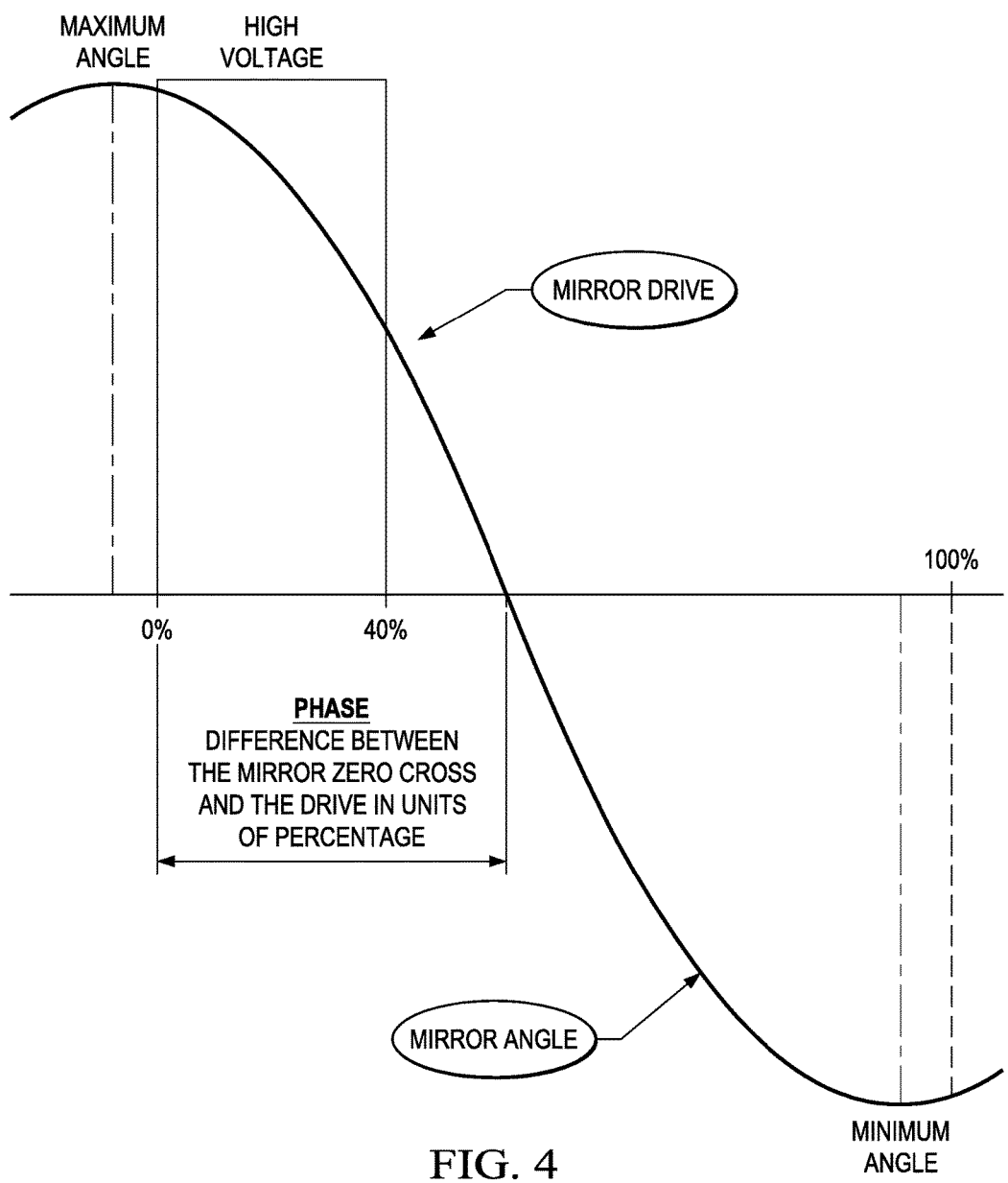
FIG. 4 is a graph illustrating a phase error between a movable MEMS mirror opening angle and a mirror drive signal.

The phase between the mirror drive signal and the opening angle θ is defined as the time difference between the mirror drive signal and the mirror positioned at an opening angle θ of zero. This is illustrated in FIG. 4, with the units of phase being represented as percentages of the mirror drive signal.

Figure 5:
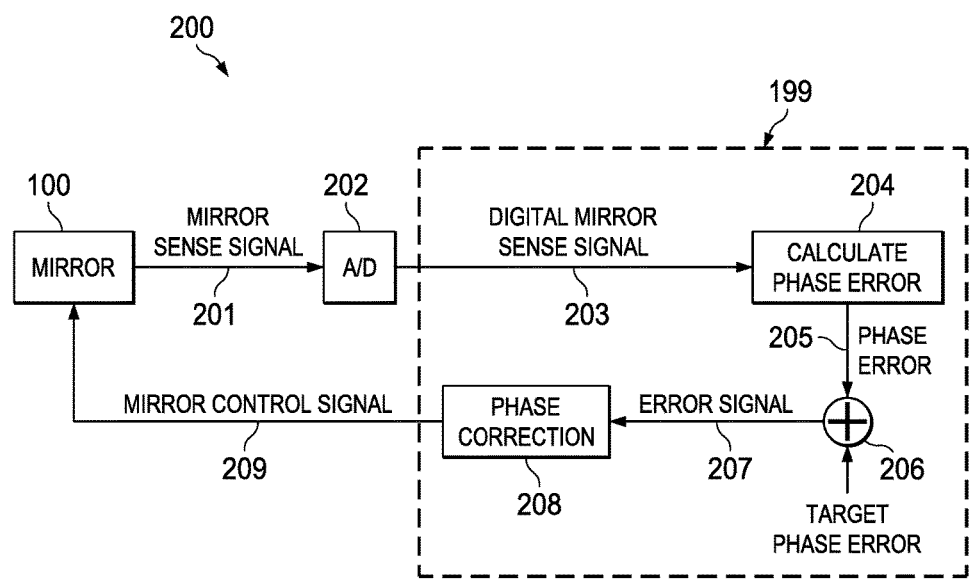
FIG. 5 is a schematic of a circuit for determining the phase error of the movable MEMS mirror of FIGS. 1-2.

With reference to FIG. 5, a circuit 200 for detecting and controlling the phase between the mirror drive signal and the opening angle θ is now described. The circuit 200 includes an analog to digital converter (ADC) 202 to receive the mirror sense signal 201. The ADC 202 digitizes the mirror sense signal 201 to produce a digital mirror sense signal 203, which is received by the control circuitry 199. In particular, the mirror sense signal 201 is a current sense signal that is digitized to produce the digital mirror sense signal 203 where the mirror is an electromagnetic mirror. In some cases, the mirror sense signal 201 may be a voltage sense signal.

The control circuitry 199 may be comprised of discrete specific purpose digital components, or may be a programmable logic controller, field programmable gate array, programmable logic array, or the like. In some cases, the control circuitry 199 may be a microprocessor or microcontroller programmed to perform specific tasks to be described below so as to render the microprocessor or microcontroller a specific purpose computer.

Functionality of the control circuitry 199 is now described. A phase error calculation block 204 receives the digital mirror sense signal 203 and from it determines a phase error 205 present in a measured phase between the mirror drive signal and a mirror at an opening angle θ of zero. This error calculation block may function as a summer, or in some cases a subtractor. A phase correction block 208 generates a mirror control signal 209 for the movable MEMS mirror 100 as a function of the error signal 207. This mirror control signal 209 serves to adjust the phase of the mirror drive signal so as to have the actual phase error 205 match the target phase error, which is typically zero. This adjustment may be done using proportional-integral-derivate techniques, for example. It should be noted that a target phase error of zero does not mean that there is no phase difference, but rather that the phase difference is a desired phase difference.

Details of the functions performed by the phase error calculation block 204 are now given. The movable MEMS mirror 100 may be treated as a changing capacitor with a capacitance value that is based upon the mirror opening angle θ. The charge on the movable MEMS mirror 100 is a function of the capacitance and the applied voltage across the capacitor (i.e. mirror drive signal) and can be represented as:

$$Q(t)=C(t)*V(t)$$

A value of current flow of the mirror sense signal 201 can be measured, and the charge on the movable MEMS mirror 100 can be related to the current value of the mirror sense signal 201 as:

$$I(t) = \frac{dQ(t)}{dt}$$

Thus, the relationship to the current flow of the mirror sense signal 201 is:

$$I(t) = \frac{dQ(t)}{dt} = V(t)*\frac{dC}{dt} + C(t)*\frac{dV}{dt}$$

Therefore, the relationship between the opening angle θ of the movable MEMS mirror 100 and the capacitance thereof is:

$$C(t)=f(\theta(t))$$

To determine the phase error 205, the phase error calculation block 204 samples the digital mirror sense signal 203 at two related points in time, and then calculates the phase error as the difference in the sample values at those points. These points in time are separated by one quarter of the expected period of the mirror drive signal, or in some cases, separated by a multiple of one quarter of the expected period of the mirror drive signal (i.e. one half of the period, three quarters of the period, etc).

Figure 6:
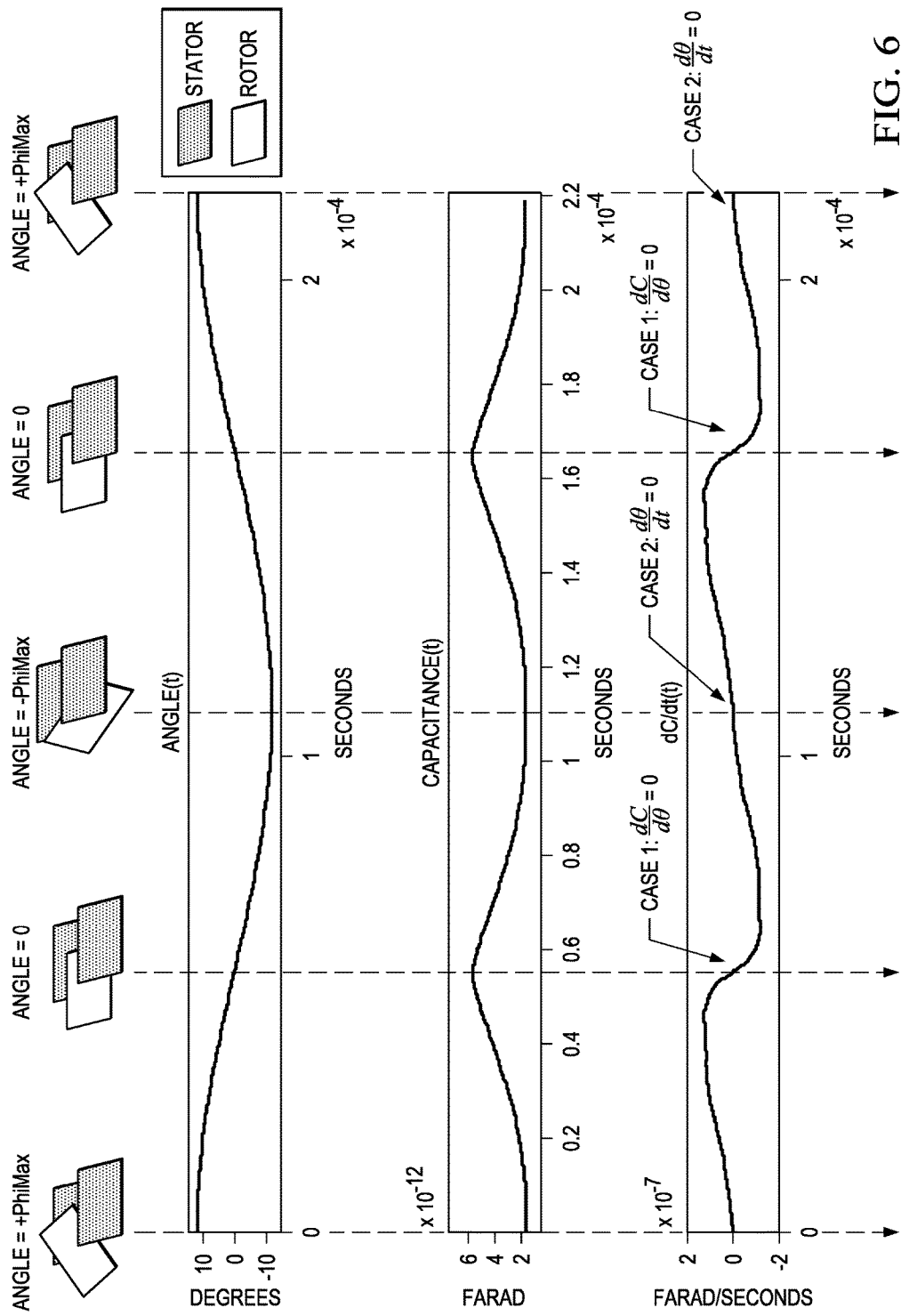
FIG. 6 is a graph showing samples of the mirror sense signal of FIG. 5 indicating a lack of phase error of the movable MEMS mirror of FIGS. 1-2.

Shown in FIG. 6 are graphs showing typical values for mirror opening angle θ, capacitance of the movable MEMS mirror 100, and $$\frac{dC(t)}{dt}.$$

It should be understood that $$\frac{dC(t)}{dt} = \frac{dC}{d\theta}\frac{d\theta}{dt}.$$

Therefore, $$\frac{dC(t)}{dt}$$

will be zero when either $$\frac{dC}{d\theta} \text{ or } \frac{d\theta}{dt}$$

is zero. In a first case, when $$\frac{dC}{d\theta}$$

is equal to zero, the mirror is at a zero crossing (i.e. the opening angle θ of the movable MEMS mirror 100 is zero). In a second case, when $$\frac{d\theta}{dt}$$

is zero, the opening angle θ of the movable MEMS mirror 100 is at its minimum angle or its maximum angle. It can be observed the points at which $$\frac{dC(t)}{dt} = 0$$

are separated by one quarter of the actual period of the mirror drive signal. Therefore, in operation, it can be inferred that if $$\frac{dC(t)}{dt}$$

is not zero at points separated by one quarter of the expected period of the mirror drive signal, a phase error is present.

As a consequence, to determine the phase error 205, the phase error calculation block 204 samples the digital mirror sense signal 203 at two successive points in time separated by one quarter of the expected period of the mirror drive signal, and determines the phase error as the difference between the sampled values at these two points. Thus, where the sample value difference between the first and second samples of the digital mirror sense signal 203 is zero, no phase error is present. Where the sample value difference between the first and second samples of the digital mirror sense signal 203 is non-zero, there is a phase error dependent upon that difference.

Figure 7:
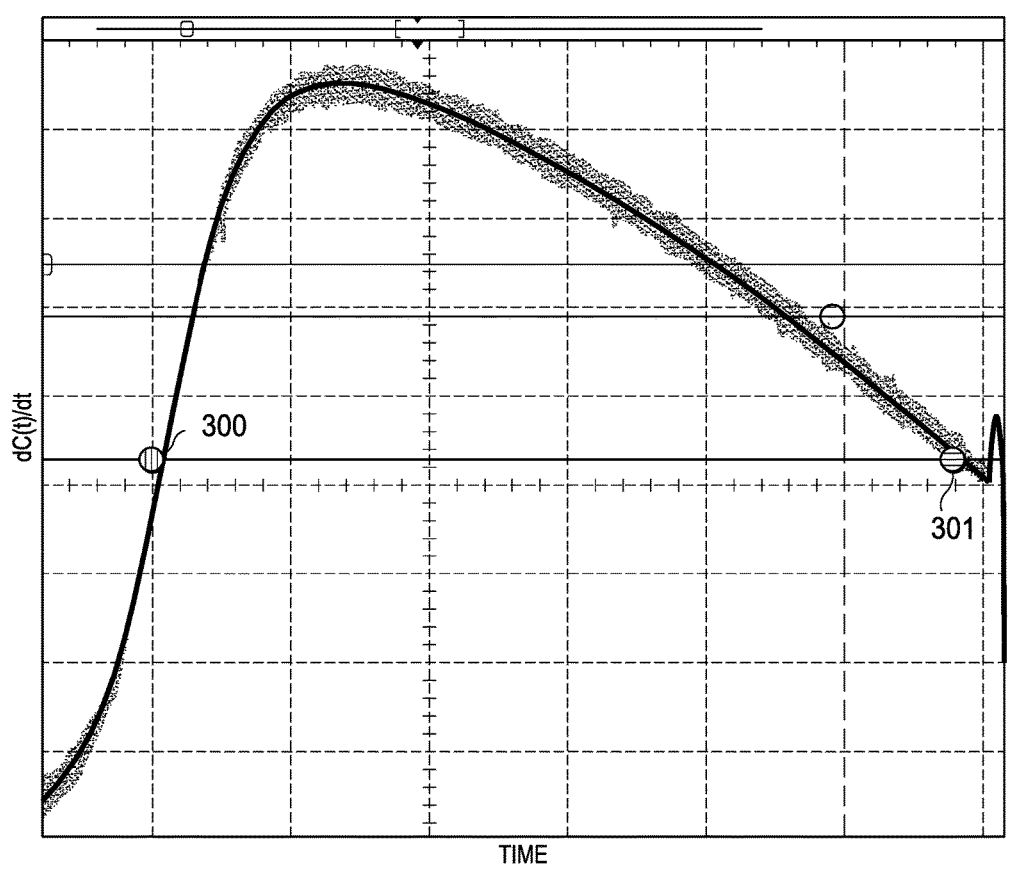
FIG. 7 is a greatly enlarged graph showing samples of the mirror sense signal of FIG. 5 in which a phase error of the movable MEMS mirror of FIGS. 1-2 is not present.

An enlarged graph of $$\frac{dC(t)}{dt}$$

of the digital mirror sense signal 203 is shown in FIG. 7. Here, it can be observed that there is no value difference along the y-axis between the first 300 and second samples 301 taken one quarter of a period apart, and that thus $$\frac{dC}{dt}$$

of each sample is equal to zero. There is no phase error present in this example.

Figure 8:
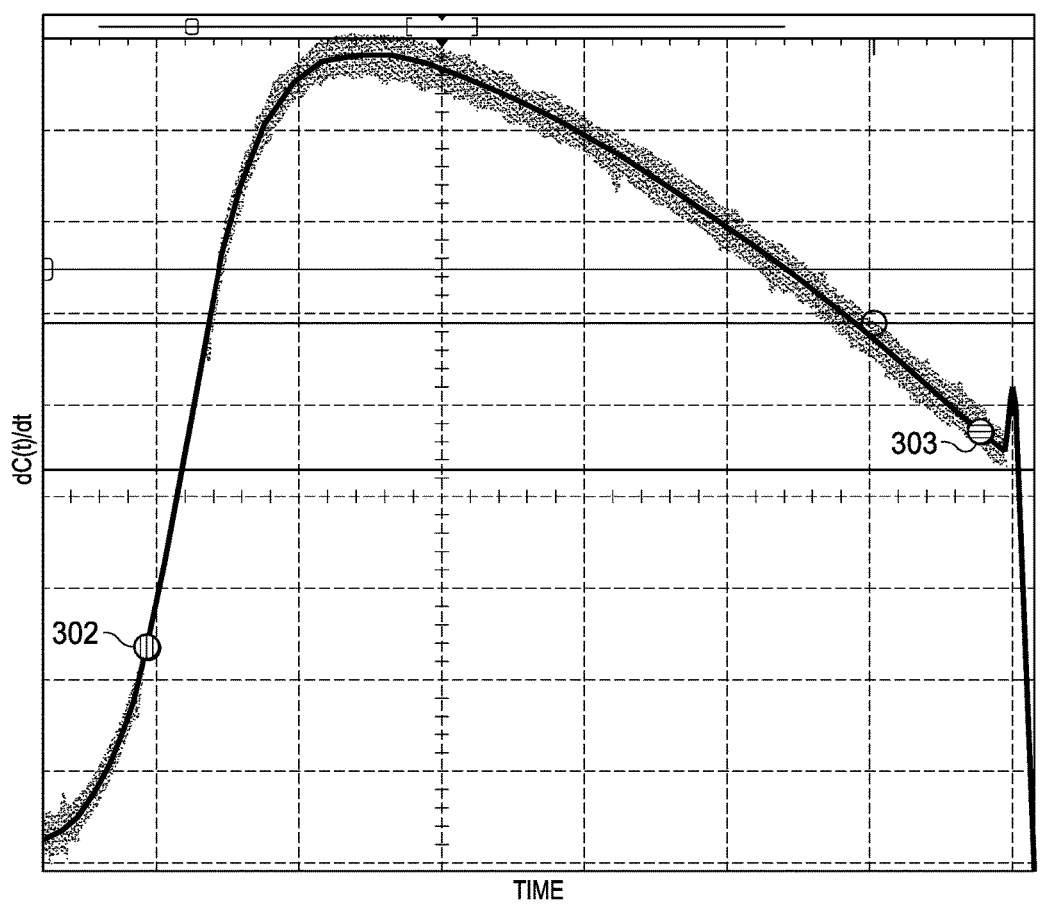
FIG. 8 is a greatly enlarged graph showing samples of the mirror sense signal of FIG. 5 in which another phase error of the movable MEMS mirror of FIGS. 1-2 is present.

Shown in FIG. 8 is a graph of $$\frac{dC(t)}{dt}$$

of the digital mirror sense signal 203 in which a positive phase error is present. Here, the value of the first sample 302 is negative, and the value of the second sample is positive 303. Thus, the value difference is non-zero and indicative of a phase error.

Figure 9:
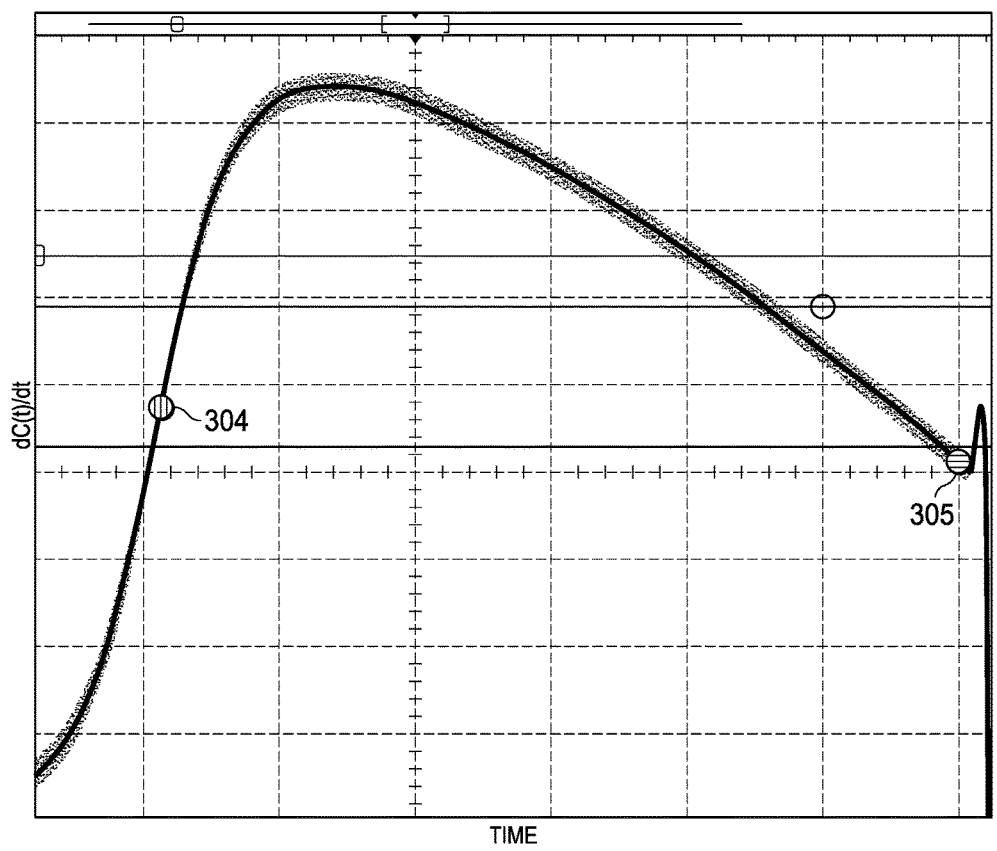
FIG. 9 is a greatly enlarged graph showing samples of the mirror sense signal of FIG. 5 in which a phase error of the movable MEMS mirror of FIGS. 1-2 is present.

A phase error may be negative as well. Shown in FIG. 9, the value of the first sample 304 is positive, and the value of the second sample 305 is negative. Here, the difference is also non-zero, also indicative of a phase error.

Through the use of the techniques described herein, the opening angle θ and phase error of the movable MEMS mirror 100 can both be determined without the use of additional components such as piezoresistive devices. In addition, should errors be introduced by the ADC 202 due to operating temperature or otherwise, those errors are canceled through the measuring of the difference between two samples.

The movable MEMS mirror 100 and associated circuitry 200 may be used in a picoprojector. The circuitry 200 allows for the maintenance of a stable phase, and reduction or elimination of phase error, over temperature changes. This also allows the opening angle θ of the movable MEMS mirror 100 to be precisely controlled over temperature changes.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
   mirror control circuitry for an oscillating mirror, the mirror control circuitry comprising:
   a processor configured to receive a mirror sense signal from the oscillating mirror and to determine a phase error between the mirror sense signal and a mirror drive signal by:
   sampling the mirror sense signal at a first time;
   sampling the mirror sense signal at a second time at which the mirror sense signal is expected to be equal to the mirror sense signal as sampled at the first time; and
   generating the phase error as a function of a difference between the sample of the mirror sense signal at the second time and the sample of the mirror sense signal at the first time.

2. The electronic device of claim 1, wherein the second time is spaced apart from the first time by one quarter of an expected period of the mirror drive signal.

3. The electronic device of claim 1, wherein the second time is spaced apart from the first time by one half of an expected period of the mirror drive signal.

4. The electronic device of claim 1, wherein the second time is spaced apart from the first time by three quarters of an expected period of the mirror drive signal.

5. The electronic device of claim 1, wherein the second time is spaced apart from the first time by a multiple of one quarter of an expected period of the mirror drive signal.

6. The electronic device of claim 1, wherein the first and second times are times at which the first and second samples of the mirror sense signal are expected to be equal in the absence of the phase error.

7. The electronic device of claim 1, wherein the processor generates the phase error as zero where the first and second times are times at which a derivative of capacitance of the oscillating mirror with respect to time is zero.

8. An electronic device, comprising:
   a mirror controller for an oscillating mirror driven by a mirror drive signal, the mirror controller comprising:
   a phase error calculation block configured to receive a mirror sense signal from the oscillating mirror and to determine a phase error between the mirror sense signal and a mirror drive signal by comparing values of the mirror sense signal separated in time by one quarter of oscillation period of an expected period of the mirror drive signal;
   an error calculation block configured to generate an error signal as a function of the phase error and a target phase error; and
   a phase correction block configured to generate a mirror control signal for the oscillating mirror as a function of the error signal.

9. The electronic device of claim 8, wherein the phase error calculation block determines the phase error by:
   sampling the mirror sense signal at a first time;
   sampling the mirror sense signal at a second time, wherein the second time is spaced apart from the first time by one quarter of the expected period of the mirror drive signal; and
   generating the phase error as a function of a difference between the sample of the mirror sense signal at the second time and the sample of the mirror sense signal at the first time.

10. The electronic device of claim 9, wherein the second time is spaced apart from the first time by a multiple of one quarter of the expected period of the mirror drive signal.

11. The electronic device of claim 9, wherein the first and second times are times at which the first and second samples of the mirror sense signal are expected to be equal in the absence of the phase error.

12. The electronic device of claim 9, wherein the phase error calculation block generates the phase error as zero where the first and second times are times at which a derivative of capacitance of the oscillating mirror with respect to time is zero.

13. The electronic device of claim 9, wherein the phase correction block generates the mirror control signal using proportional-integral-derivative techniques.

14. The electronic device of claim 9, further comprising an analog to digital converter configured to digitize the mirror sense signal to a digital mirror sense signal; and wherein the phase error calculation block receives the digital mirror sense signal and determines the phase error between the mirror sense signal and the mirror drive signal.

15. A method of operating an oscillating mirror, comprising:
   driving the oscillating mirror with a mirror drive signal;
   receiving a mirror sense signal from the oscillating mirror;
   determining a phase error between the mirror sense signal and the mirror drive signal by comparing values of the mirror sense signal separated in time by one quarter of oscillation period of an expected period of the mirror drive signal;
   generating an error signal as a function of the phase error and a target phase error; and
   generating a mirror control signal for the oscillating mirror as a function of the error signal.

16. The method of claim 15, wherein the phase error is determined by:

sampling the mirror sense signal at a first time;
sampling the mirror sense signal at a second time after the first time, wherein the second time is spaced apart from the first time by one quarter of the expected period of the mirror drive signal; and
generating the phase error as a function of a difference between the sample of the mirror sense signal at the second time and the sample of the mirror sense signal at the first time.

17. The method of claim 16, wherein the second time is spaced apart from the first time by a multiple of one quarter of an expected period of the mirror drive signal.

18. The method of claim 17, wherein the first and second times are times at which the first and second samples of the mirror sense signal are expected to be equal in the absence of the phase error.

19. The method of claim 16, wherein the first and second times are times at which the first and second samples of the mirror sense signal are expected to be equal in the absence of the phase error.

20. The method of claim 16, wherein the phase error is generated as zero where the first and second times are times at which a derivative of capacitance of the oscillating mirror with respect to time is zero.

21. The method of claim 15, wherein the mirror control signal is generated using proportional-integral-derivative techniques.

* * * * *